(12) United States Patent
Kim et al.

(10) Patent No.: US 7,915,862 B2
(45) Date of Patent: Mar. 29, 2011

(54) APPARATUS AND METHOD FOR MEASURING BATTERY CHARGE LEVEL OF PORTABLE TERMINAL

(75) Inventors: Hyun-Yil Kim, Gumi-si (KR); Ki-Ho Cho, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 662 days.

(21) Appl. No.: 11/947,419

(22) Filed: Nov. 29, 2007

(65) Prior Publication Data

US 2008/0238207 A1 Oct. 2, 2008

(30) Foreign Application Priority Data

Mar. 27, 2007 (KR) ........................ 10-2007-0029803

(51) Int. Cl.
*H02J 7/00* (2006.01)

(52) U.S. Cl. ...................................................... 320/133
(58) Field of Classification Search .................. 320/133
See application file for complete search history.

(56) References Cited

U.S. PATENT DOCUMENTS

| 5,623,193 | A  | * | 4/1997  | Lang et al.     | 320/136 |
|-----------|----|---|---------|-----------------|---------|
| 6,229,287 | B1 | * | 5/2001  | Ferris et al.   | 320/141 |
| 7,133,703 | B2 | * | 11/2006 | Aoshima et al.  | 455/574 |
| 7,449,864 | B2 | * | 11/2008 | Kwon et al.     | 320/132 |

\* cited by examiner

*Primary Examiner* — Edward Tso
*Assistant Examiner* — M'Baye Diao
(74) *Attorney, Agent, or Firm* — H.C. Park & Associates, PLC

(57) ABSTRACT

Disclosed is a method for measuring a battery charge level of a portable terminal having a removable back-up battery. The method includes determining that the back-up battery is connected in parallel to an main battery of the portable terminal, disconnecting the main battery from the back-up battery for a period of time in a cycle, and checking voltage levels of the main battery and the back-up battery to measure a charge level of each battery while the batteries are disconnected.

19 Claims, 4 Drawing Sheets

APPARATUS AND METHOD FOR MEASURING BATTERY CHARGE LEVEL OF PORTABLE TERMINAL

CROSS REFERENCE TO RELATED APPLICATION

This application claims priority from and the benefit of Korean Patent Application No. 10-2007-0029803, filed on Mar. 27, 2007, which is hereby incorporated by reference for all purposes as if fully set forth herein.

BACKGROUND OF THE INVENTION

1. Field of the Invention

The present invention relates to an apparatus and a method for measuring the battery charge level of a portable terminal, and more particularly to an apparatus and a method for measuring the charge level of an main/back-up battery of a portable terminal to which the back-up battery can be fastened.

2. Discussion of the Background

As generally known in the art, recent portable terminals tend to incorporate more functions in order to satisfy ever-increasing user demands. Particularly, portable terminals are expected to incorporate not only functions related to email, Internet, and games, but also multimedia functions for transmitting data and images, which have become popular.

However, this trend has caused a problem in that, although users are provided with various convenient functions, the terminals, particularly their batteries, inevitably consume a large amount of power. This means that user must charge the batteries more frequently.

In an attempt to avoid this problem, it has been proposed that removable back-up batteries, which can be attached to/removed from the terminals as desired, be employed.

When a portable terminal is equipped with a removable back-up battery, the relative potential between the voltage level of the main battery and that of the back-up battery is used to realize a charging/discharging algorithm. This means that, unless the potential of each battery is accurately measured, the charging/discharging algorithm cannot be realized correctly.

For these reasons, when portable terminals are provided with back-up batteries, it is customary to check the voltage level from the output terminal of each battery in order to measure the potential value corresponding to the actual charge levels of the main and back-up batteries.

When main and back-up batteries are connected in parallel and have different potentials, they tend to maintain the same potential. For example, if a main battery having a voltage of 3.4 V is connected in parallel with a back-up battery having a voltage of 3.8 V, the batteries have an average voltage of about 3.6 V. The batteries regain their original voltage levels when disconnected from each other.

In summary, the conventional algorithm has a problem in that it may not be possible to know the exact potential value corresponding to the actual charge level of each battery simply by checking the voltage levels from the output terminals of respective batteries that are connected in parallel.

SUMMARY OF THE INVENTION

The present invention provides an apparatus and a method for accurately measuring the charge levels of main and back-up batteries of a portable terminal when they are connected in parallel.

Additional features of the invention will be set forth in the description which follows, and in part will be apparent from the description, or may be learned by practice of the invention.

The present invention discloses a method for measuring a battery charge level of a portable terminal having a removable back-up battery including determining that the back-up battery is connected in parallel to an main battery of the portable terminal, disconnecting the main and back-up batteries from each other for a period of time in a cycle, and checking voltage levels of the main and back-up batteries to measure a charge level of each battery while the batteries are disconnected.

The present invention also discloses an apparatus for measuring a battery charge level of a portable terminal having a removable back-up battery including a switch unit and a control unit. The switch unit connects the back-up battery and a main battery of the portable terminal in parallel. The control unit controls the switch unit for a period of time in a cycle, so that the main and back-up batteries are disconnected from each other and measures charge levels of the main and back-up batteries while the batteries are disconnected from each other.

The present invention also discloses a method of providing power to a device including a main battery and a back-up battery. The method includes providing power to the device from the main battery while the main battery has a voltage level above a first value. Power is provided to the device from the main battery and the back-up battery during a first cycle when the voltage level of the main battery is below the first value and the main battery and the back-up battery are connected in parallel with each other. The main battery is disconnected from the back-up battery for a period of time in the first cycle.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
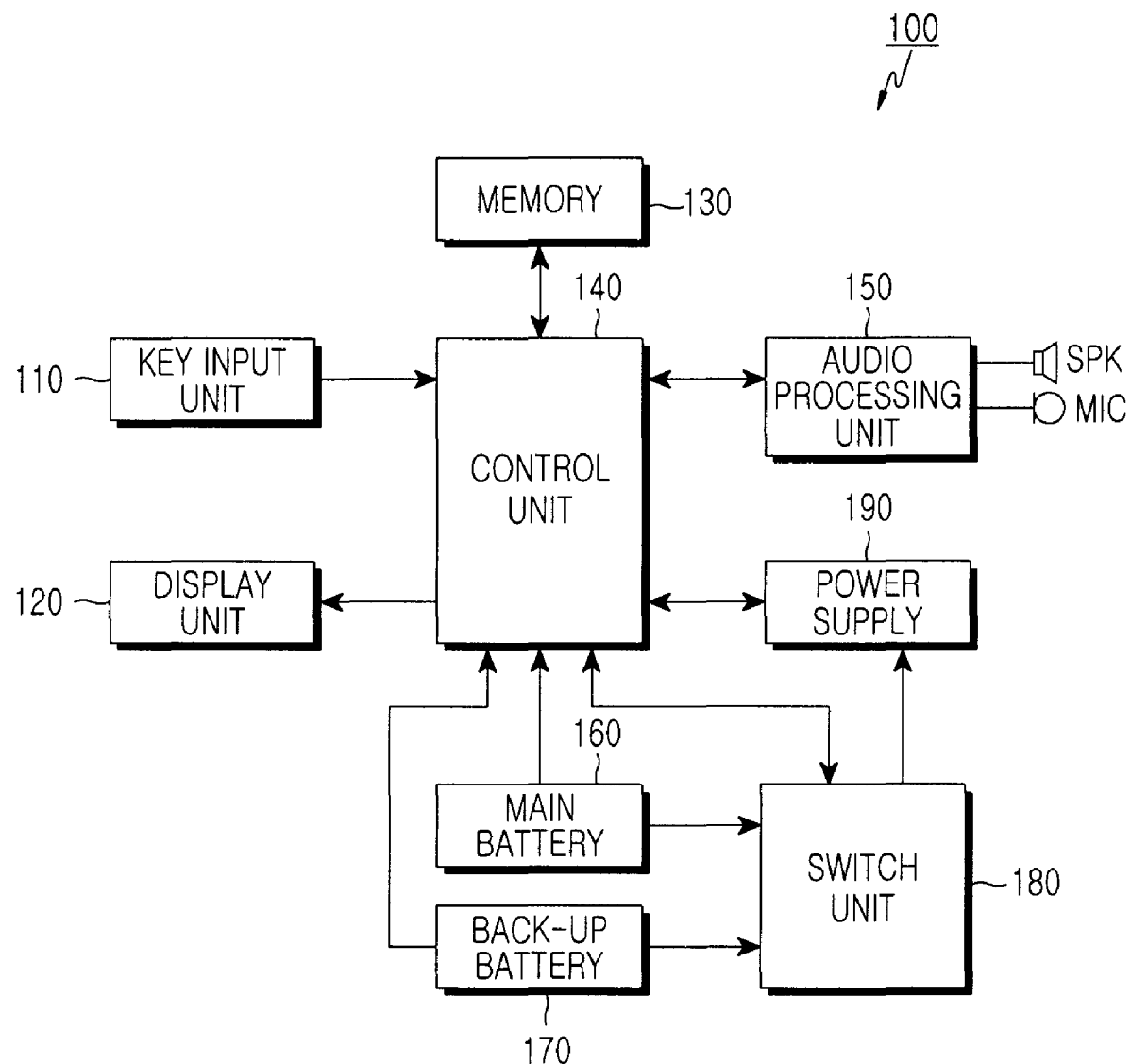
FIG. 1 is a block diagram showing the construction of a portable terminal according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

FIG. 1 is a block diagram showing the construction of a portable terminal according to an exemplary embodiment of the present invention.

As shown, the portable terminal 100 includes a key input unit 110, a display unit 120, a memory 130, a control unit 140, an audio processing unit 150, an main battery 160, a back-up battery 170, a switch unit 180, and a power supply 190.

The key input unit 110 may have character keys, numeral keys, various function keys, and a back-up volume key so that when the user operates the keys, corresponding key input signals are output to the control unit 140.

The display unit 120 may include a liquid crystal display (LCD), for example, and may output various display data created by the portable terminal. When a touch screen-type LCD is used, the display unit 120 may also be used as an input unit.

The memory 130 may include program memory, data memories, etc. According to the present exemplary embodiment, the memory 130 stores various pieces of information necessary to control the operation of the portable terminal 100, as well as those selected by the user.

The control unit 140 controls the overall operation of the portable terminal 100 according to the present exemplary embodiment.

The control unit 140 checks the charge level of the main battery 160 while using power from the main battery 160. If the charge level is below a predetermined threshold, the control unit 140 turns on the switch unit 180 so that the main and back-up batteries 160 and 170 are connected in parallel.

After the main and back-up batteries 160 and 170 are connected in parallel with each other via the switch unit 180, the control unit 140 controls the switch unit 180 to disconnect the batteries 160 and 170 from each other for a predetermined period of time (e.g. 20 ms) in a predetermined cycle (e.g. every second). The control unit 140 checks the voltage levels of the main and back-up batteries 160 and 170 while the batteries are disconnected from each other to measure the charge levels of the batteries 160 and 170. The portable terminal 100 may have a separate voltage sensing unit (not shown) to check the voltage levels of the main and back-up batteries 160 and 170.

If it is determined that the voltage level of the main battery 160 is higher than that of the back-up battery 170, the control unit 140 controls the switch unit 180 to remain off.

The period of time, during which the control unit 140 controls the switch unit 180 to disconnect the main battery 160 from the back-up battery 170 and checks the respective voltage levels, may be sufficiently small (e.g. 20 ms) to suppress errors while the overall algorithm is executed.

If the charge level of the main battery 160 drops below a predetermined threshold while power from the main battery 160 is being used, the control unit 140 checks if a back-up battery 170 is mounted on the portable terminal 100. If not, a message informing the user that a back-up battery 170 is necessary, i.e. that a back-up battery 170 should be mounted on the terminal, may be output under the control of the control unit 140.

The audio processing unit 150 modulates electric signals, which are input from a microphone MIC, into voice data. In addition, the audio processing unit 150 demodulates encoded voice data, which is input from a wireless transceiver (not shown), into electric signals and outputs them via a speaker SPK.

The audio processing unit 150 preferably has a codec to convert digital audio signals, which are received from the wireless transceiver, into analog signals and to play the analog signals and to convert analog audio signals, which are created by the microphone MIC, into digital audio signals. The codec includes a data codec to process packet data, for example, and an audio codec to process audio signals (e.g. voices). The codecs may be provided separately or may be incorporated in the control unit 140.

The main and back-up batteries 160 and 170 apply power to the power supply 190 under the control of the control unit 140. The back-up battery 170 can be fastened to/removed from the portable terminal 100.

The switch unit 180 may be turned on/off under the control of the control unit 140 so that the main and back-up batteries 160 and 170 are connected in parallel with, or disconnected from, each other. The switch unit 180 transmits power from the main and back-up batteries 160 and 170, which are connected in parallel, to the power supply 190. If necessary, the switch unit 180 may switch between the main and back-up batteries 160 and 170 under the control of the control unit 140 so that power is transmitted from the switched battery to the power supply 190.

The power supply 190 adjusts power, which is transmitted via the switch unit 180, to a suitable level and supplies the resulting DC voltage to respective components of the portable terminal 100.

Figure 2:
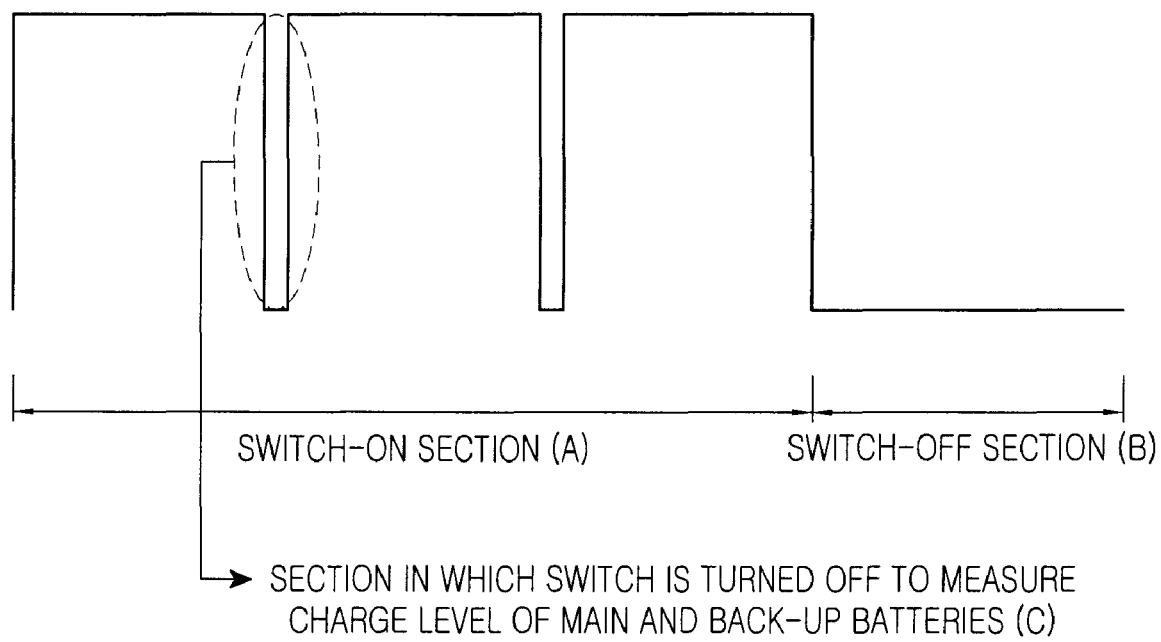
FIG. 2 shows the waveform of a voltage applied to a switch unit in order to measure the charge level of a battery of a portable terminal according to an exemplary embodiment of the present invention.

FIG. 2 shows the waveform of a voltage applied to a switch unit in order to measure the charge level of a battery of a portable terminal according to an exemplary embodiment of the present invention.

Referring to FIG. 1 and FIG. 2, when a high voltage is applied to the switch unit 180, it is turned on so that the main and back-up batteries 160 and 170 are connected in parallel in switch-on section A. When a low voltage is supplied to the switch unit 180, it is turned off so that the main and back-up batteries 160 and 170 are disconnected from each other in switch-off section B. As used herein, switch-off section B refers to a section in which, when the voltage of the main battery 160 is higher than that of the back-up battery 170, the batteries are completely disconnected from each other.

Section C, in which the main and external batteries 160 and 170 are disconnected from each other in order to check their voltage levels, is determined in such a manner that no error occurs while the overall algorithm is executed. Although section C is actually a short switch-off section, it is included in switch-on section A as far as the algorithm is concerned.

Figure 3:
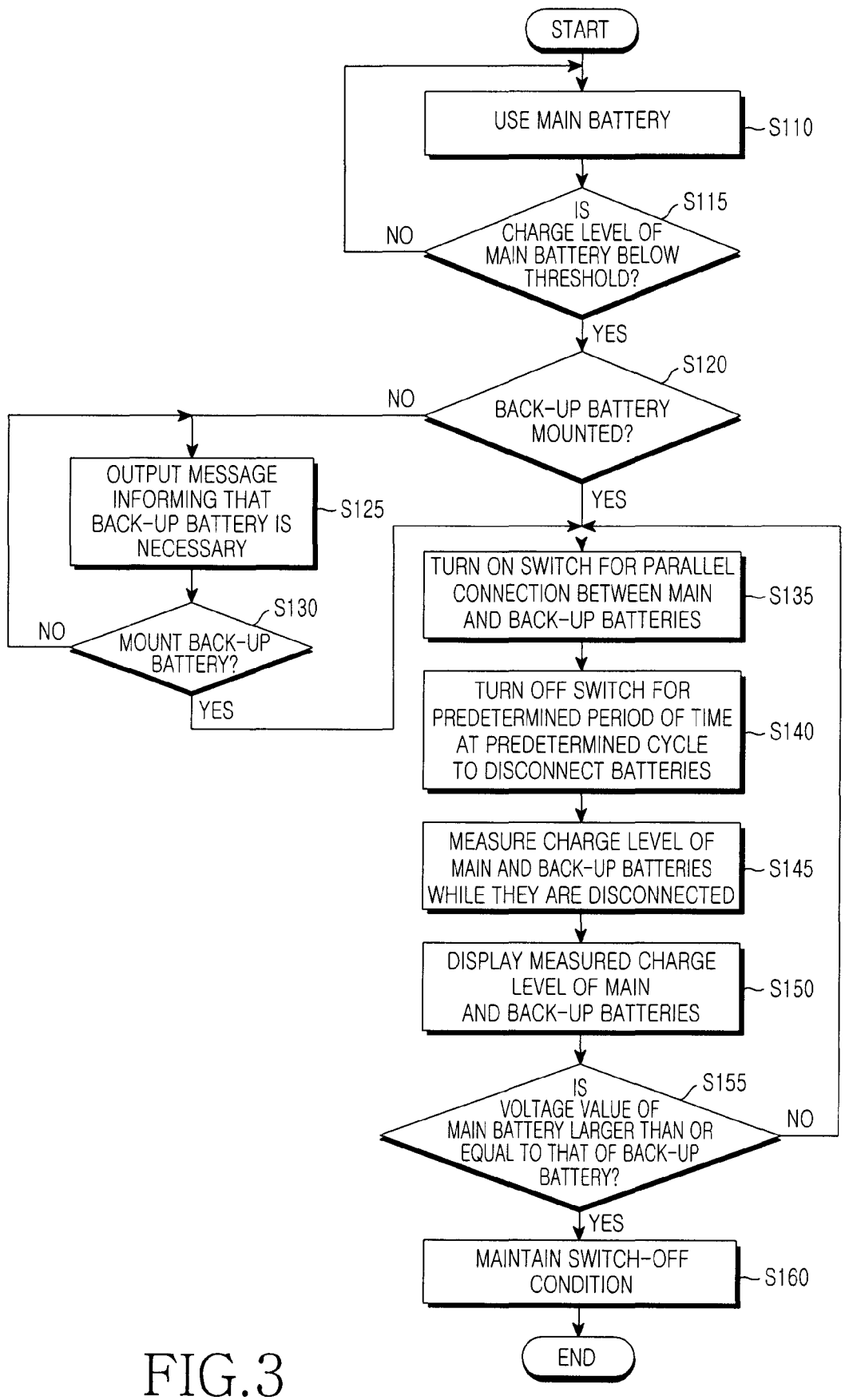
FIG. 3 is a flowchart showing steps for operating a portable terminal according to a first exemplary embodiment of the present invention.

FIG. 3 is a flowchart showing steps for operating a portable terminal according to a first exemplary embodiment of the present invention.

Referring to FIG. 1 and FIG. 3, when the portable terminal 100 is turned on, the control unit 140 uses power from the main battery 160 (S110). Particularly, the control unit 140 controls the switch unit 180 so that the main battery 160 and the power supply 190 are connected and transmits power from the main battery 160 to the power supply 190.

The control unit 140 checks if the charge level of the main battery 160 is below a predetermined threshold while using power from the main battery 160 (S115). The threshold may be a basis for determining whether or not to output a message warning of a lower battery voltage. The control unit 140 may periodically check the voltage of the main battery 160 to measure the battery charge level.

If it is confirmed as a result of the check that the charge level of the main battery 160 is below the threshold, the control unit 140 checks if the portable terminal 100 has a back-up battery 170 mounted thereon (S120).

If portable terminal 100 has a back-up battery 170 mounted thereon, the control unit 140 turns on the switch unit 180 so that the main and back-up batteries 160 and 170 are connected in parallel (S135).

If the portable terminal 100 has no back-up battery 170 mounted thereon, the control unit 140 outputs a character or voice message informing the user that a back-up battery 170 is necessary (S125). Alternatively the character or voice message may inform the user that the main battery 160 needs to be re-charged.

After outputting the message, the control unit 140 checks if a back-up battery 170 is mounted (S130).

If a back-up battery 170 is mounted on the portable terminal 100, the control unit 140 turns on the switch 180 so that the main and back-up batteries 160 and 170 are connected in parallel (S135).

After the main and back-up batteries 160 and 170 are connected in parallel, the control unit 140 turns off the switch unit 180 for a predetermined period of time (e.g. 20 ms) in a predetermined cycle (e.g. every second) so that the batteries are disconnected from each other (S140). The predetermined period of time, during which the switch unit 180 is turned off, is for the purpose of checking the voltage levels of the main and back-up batteries 160 and 170 and is determined in such a manner that no error occurs while the overall algorithm is executed.

The control unit 140 checks the voltage levels of the main and back-up batteries 160 and 170 and measures their charge levels while the batteries are disconnected from each other (S145).

The control unit 140 displays the measured charge levels of the main and back-up batteries 160 and 170 via the display unit 120 (S150).

The control unit 140 checks if the voltage level of the main battery 160 is greater than or equal to that of the back-up battery 170 (S155).

If the voltage level of the main battery 160 is less than that of the back-up battery 170, the control unit 140 may return to step S135 and turn on the switch unit 180, which had been turned off for the predetermined period of time.

If the voltage value of the main battery 160 is greater than or equal to that of the back-up battery 170, the control unit 140 keeps the switch unit 180 turned off and ends the operation (S 160). This is for the purpose of preventing an inverse flow of current from the main battery 160 to the back-up battery 170.

Figure 4:
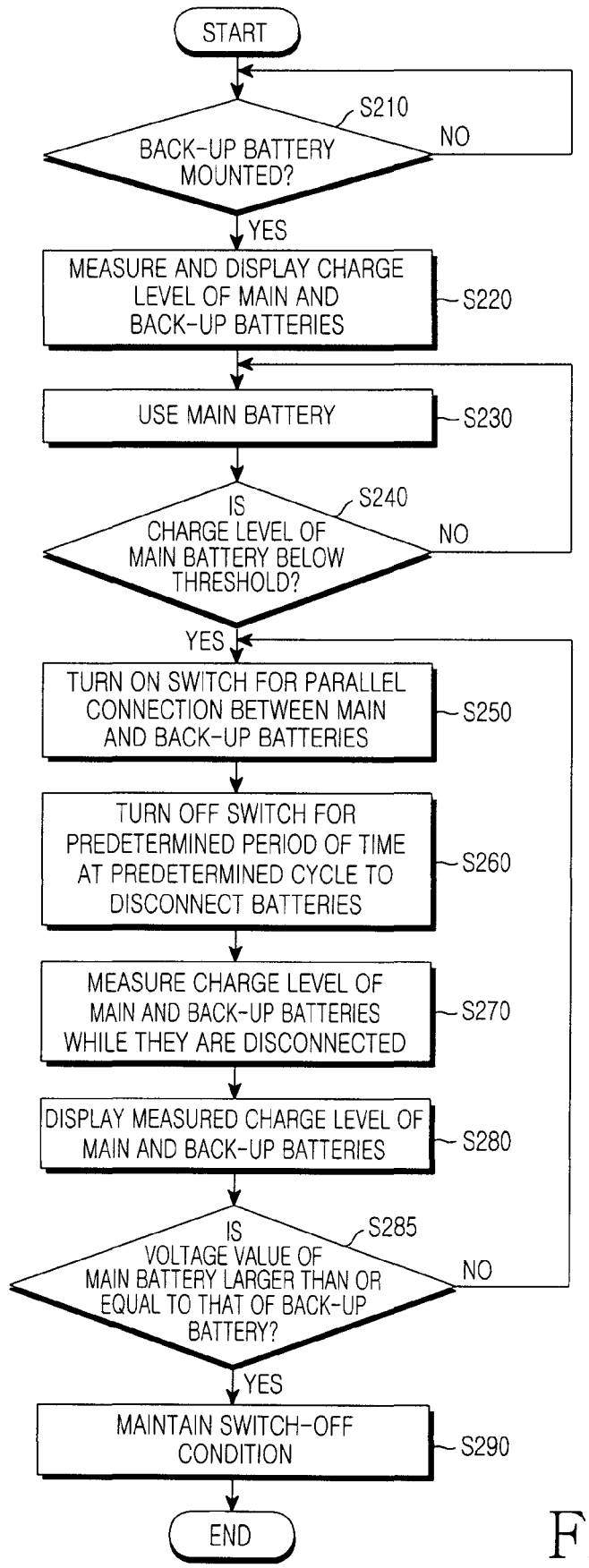
FIG. 4 is a flowchart showing steps for operating a portable terminal according to a second exemplary embodiment of the present invention.

FIG. 4 is a flowchart showing steps for operating a portable terminal according to a second exemplary embodiment of the present invention.

Referring to FIG. 1 and FIG. 4, the control unit 140 checks if the portable terminal 100 has a back-up battery 170 mounted thereon (S210).

If the portable terminal 100 has a back-up battery 170 mounted thereon, the control unit 140 measures the charge levels of the main and back-up batteries 160 and 170, and displays the measured levels via the display unit 120 (S220). The display unit 120 commonly displays each measured battery charge level as an icon having the shape of a battery.

The control unit 140 uses power from the main battery 160 (S230). Particularly, the control unit 140 controls the switch unit 180 so that the main battery 160 and the power supply are connected even when the back-up battery 170 is mounted. The control unit 140 then receives power from the main battery 160 and applies it to the power supply 190.

The control unit 140 checks if the charge level of the main battery 160 is below a predetermined threshold while using power from the main battery 160 (S240). The threshold may be a basis for determining by the terminal whether or not to output a message warning of a lower battery voltage. The control unit 140 keeps using power from the main battery 160 as long as the charge level is not below the threshold.

If the charge level of the main battery 160 is below the threshold, the control unit 140 turns on the switch unit 180 so that the main and back-up batteries 160 and 170 are connected in parallel (S250). The control unit 140 may output a message informing that the user that the charge level is insufficient or that a back-up battery 170 will be used.

After the main and back-up batteries 160 and 170 are connected in parallel, the control unit 140 turns off the switch unit 180 for a predetermined period of time (e.g. 20 ms) in a predetermined cycle (e.g. every second) so that the batteries are disconnected from each other (S260). The predetermined period of time, during which the control unit 140 turns off the switch unit 180, is for the purpose of checking the voltage levels of the main and back-up batteries 160 and 170 and is determined in such a manner that no error occurs while the overall algorithm is executed.

The control unit 140 checks the voltage levels of the main and back-up batteries 160 and 170 and measures their charge levels in the period of time during which the batteries are disconnected from each other (S270).

The control unit 140 displays the measured charge levels of the main and back-up batteries 160 and 170 via the display unit 120 (S280).

The control unit 140 checks if the voltage level of the main battery 160 is greater than or equal to that of the back-up battery 170 (S285).

If the voltage value of the main battery 160 is smaller than that of the back-up battery 170, the control unit 140 returns to step S250 and turns on the switch unit 180, which has been turned off for the predetermined period of time, so that the batteries 160 and 170 are connected in parallel.

If the voltage value of the main battery 160 is greater than or equal to that of the back-up battery 170, the control unit 140 keeps the switch unit 180 turned off and ends the operation (S290). This is for the purpose of preventing an inverse flow of current from the main battery 160 to the back-up battery 170.

As described above, exemplary embodiments of the present invention may accurately measure the charge levels of main and back-up batteries of a portable terminal, to which the back-up battery can be fastened, and may inform the user of the battery charge levels. In addition, various charging/discharging algorithms may be realized based on the relative potential between the main and back-up batteries.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for measuring a battery charge level for a portable terminal, comprising:
   connecting a back-up battery in parallel to a main battery of the portable terminal;
   momentarily disconnecting the main battery from the back-up battery for a period of time in a cycle;

checking voltage levels of the main battery and the back-up battery to measure a charge level of each battery while the batteries are momentarily disconnected from each other; and reconnecting the back-up battery in parallel to the main battery immediately after checking the voltage levels of the main battery and the back-up battery, wherein the back-up battery is reconnected in parallel to the main battery after checking the voltage levels of the main battery and the back-up battery when a voltage level of the main battery is not greater than or equal to a voltage level of the back-up battery.

2. The method of claim 1, wherein connecting the back-up battery in parallel to the main battery comprises turning on a switch to connect the main battery to the back-up battery in parallel when the charge level of the main battery is below a threshold, and wherein disconnecting the main battery from the back-up battery comprises turning off the switch for the period of time in the cycle.

3. The method of claim 2, wherein turning on the switch comprises:

checking if the back-up battery is mounted when the charge level of the main battery is below the threshold;

outputting a message that the back-up battery is necessary when the back-up battery is not mounted; and turning on the switch when the back-up battery is mounted so that the main battery is connected to the back-up battery in parallel.

4. The method of claim 1, further comprising maintaining the disconnection between the main battery and the back-up battery after checking the voltage levels of the main battery and the back-up battery when a voltage level of the main battery is greater than or equal to a voltage level of the back-up battery.

5. The method of claim 1, further comprising displaying the measured charge levels of the main battery and the back-up battery.

6. An apparatus for measuring a battery charge level of a portable terminal, the apparatus comprising:

a switch unit to connect a back-up battery and a main battery of the portable terminal in parallel; and a control unit to control the switch unit for a period of time in a cycle so that the main battery is momentarily disconnected from the back-up battery and to check charge levels of the main battery and the back-up battery while the batteries are momentarily disconnected from each other.

7. The apparatus of claim 6, wherein the control unit is adapted to turn on the switch unit when the charge level of the main battery is below a threshold, so that the main battery is connected to the back-up battery.

8. The apparatus of claim 6, wherein the control unit is adapted to check if the back-up battery is mounted when the charge level of the main battery is below the threshold and to output a message that the back-up battery is necessary when the back-up battery is not mounted.

9. The apparatus of claim 6, wherein the control unit is adapted to keep the switch unit turned off when a voltage level of the main battery is greater than or equal to a voltage level of the back-up battery.

10. The apparatus of claim 6, wherein the control unit is adapted to display the measured charge levels of the main battery and the back-up battery.

11. A method of providing power to a device comprising a main battery and a back-up battery, the method comprising:

providing power to the device from the main battery while the main battery has a voltage level above a first value;

providing power to the device from the main battery and the back-up battery during a first cycle when the voltage level of the main battery is below the first value, the main battery and the back-up battery being connected in parallel with each other;

disconnecting the main battery from the back-up battery for a period of time in the first cycle;

checking a voltage level of the main battery and a voltage level of the back-up battery during the period of time; and providing power to the device from the main battery and the back-up battery during a second cycle when the checked voltage level of the main battery is below the checked voltage level of the back-up battery, the main battery and the back-up battery being connected in parallel with each other;

wherein the second cycle immediately follows the first cycle in time.

12. The method of claim 11, further comprising:

maintaining the disconnection of the main battery and the back-up battery when the checked voltage level of the main battery exceeds the checked voltage level of the back-up battery.

13. The method of claim 11, further comprising:

providing power to the device from the back-up battery during the period of time in the first cycle.

14. The method of claim 11, further comprising:

providing power to the device from the main battery during the period of time in the first cycle.

15. The method of claim 1, wherein momentarily disconnecting the main battery from the back-up battery comprises disconnecting the main battery from the back-up battery for 20 milliseconds.

16. The apparatus of claim 6, wherein the control unit is configured to reconnect the back-up battery in parallel to the main battery after checking the charge levels of the main battery and the back-up battery.

17. The apparatus of claim 6, wherein the control unit is configured to momentarily disconnect the main battery from the back-up battery for 20 milliseconds.

18. A method for measuring a battery charge level for a portable terminal, comprising:

connecting a back-up battery in parallel to a main battery of the portable terminal in a first portion of a first cycle;

disconnecting the main battery from the back-up battery in a second portion of the first cycle;

checking voltage levels of the main battery and the back-up battery to measure a charge level of each battery while the batteries are disconnected from each other; and repeating the connecting, the disconnecting, and the checking for a plurality of cycles immediately following the first cycle, each of the plurality of cycles immediately following a preceding cycle.

19. The method of claim 18, further comprising maintaining the disconnection between the main battery and the back-up battery after checking the voltage levels of the main battery and the back-up battery when a voltage level of the main battery is greater than or equal to a voltage level of the back-up battery.

* * * * *